(12) United States Patent
Chui

(10) Patent No.: US 7,432,771 B2
(45) Date of Patent: Oct. 7, 2008

(54) OSCILLATOR CIRCUIT HAVING TEMPERATURE AND SUPPLY VOLTAGE COMPENSATION

(75) Inventor: Martin Yeung-Kei Chui, Hong Kong (HK)

(73) Assignee: Smartech Worldwide Limited, Hong Kong (CN)

( * ) Notice: Subject to any disclaimer, the term of this patent is extended or adjusted under 35 U.S.C. 154(b) by 202 days.

(21) Appl. No.: 11/445,811

(22) Filed: Jun. 2, 2006

(65) Prior Publication Data

US 2007/0279141 A1 Dec. 6, 2007

(51) Int. Cl.
*H03K 3/286* (2006.01)
(52) U.S. Cl. ............. 331/144; 331/113 R; 331/176
(58) Field of Classification Search ............. 331/111, 331/113 R, 143, 144, 185, 176, 186
See application file for complete search history.

(56) References Cited

U.S. PATENT DOCUMENTS

| 5,180,995 | A | * | 1/1993 | Hayashi et al. | ........... 331/57 |
| 5,638,029 | A | * | 6/1997 | O'Shaughnessy | ........... 331/44 |
| 5,870,004 | A | | 2/1999 | Lu | |
| 6,356,161 | B1 | | 3/2002 | Nolan | |
| 6,825,735 | B2 | | 11/2004 | Chung | |
| 6,917,249 | B1 | | 7/2005 | Kuo | |
| 6,980,062 | B2 | | 12/2005 | Fujita | |
| 7,034,627 | B1 | | 4/2006 | Kudari | |
| 7,049,899 | B2 | | 5/2006 | Kato | |

* cited by examiner

*Primary Examiner*—Robert J. Pascal
*Assistant Examiner*—James E Goodley
(74) *Attorney, Agent, or Firm*—Xin Wen

(57) ABSTRACT

An oscillator circuit includes a current source comprising an amplifier, a first resistor, a second resistor, and a third inverter whose input and output are connected and coupled with an input of the amplifier. The amplifier is configured to generate a first current flowing through the first resistor and the second resistor. The oscillator circuit also includes a vibrator circuit comprising a first capacitor and a second capacitor, wherein the first capacitor is configured to charge in response to the first current and discharge when the voltage across the first capacitor reaches a first threshold voltage of a first inverter and the second capacitor is configured to charge in response to the first current and discharge when the voltage across the first capacitor reaches a second threshold voltage of a second inverter and a latch circuit comprising the first inverter and the second inverter, wherein the latch circuit is configured to produce an oscillating signal in response to the charging and the discharging of the first capacitor and the second capacitor in the vibrator circuit.

19 Claims, 5 Drawing Sheets

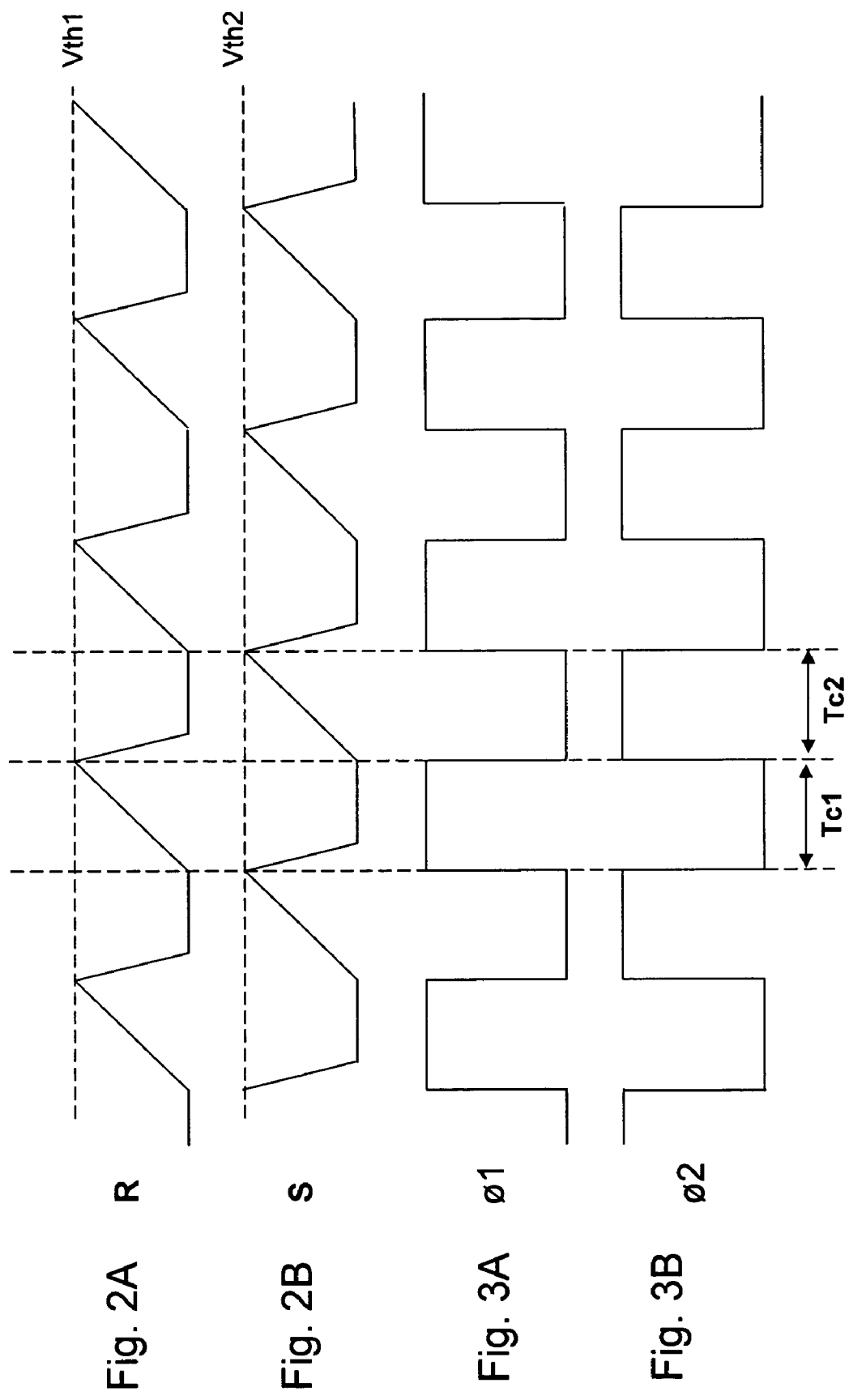

OSCILLATOR CIRCUIT HAVING TEMPERATURE AND SUPPLY VOLTAGE COMPENSATION

BACKGROUND

The present disclosure relates to an electronic oscillator circuit that can generate electric oscillation signals.

An oscillator is an electronic circuit that generates an oscillation signal having a constant oscillation frequency. An oscillator is required to have a reliable oscillation frequency. The oscillator must maintain a constant oscillation frequency regardless of the changes in the external conditions such as variations in temperature and power supply voltage. A challenge to the oscillator circuit design is to provide oscillation signal that can have stable oscillation frequency in the presence of temperature and supply voltage variations. While some oscillatory circuit designs attempt to compensate temperature variations, the circuit designs are complex and not easy to implement. It is therefore desirable to develop a simple and easy-to-implement oscillator circuit that can produce oscillation signals having constant oscillation frequency.

SUMMARY

In a general aspect, the present invention relates to an oscillator circuit including: a current source comprising an amplifier, a first resistor, a second resistor, and a third inverter whose input and output are connected and coupled with an input of the amplifier, wherein the amplifier is configured to generate a first current flowing through the first resistor and the second resistor; a vibrator circuit comprising a first capacitor and a second capacitor, wherein the first capacitor is configured to charge in response to the first current and discharge when the voltage across the first capacitor reaches a first threshold voltage of a first inverter and the second capacitor is configured to charge in response to the first current and discharge when the voltage across the first capacitor reaches a second threshold voltage of a second inverter; and a latch circuit comprising the first inverter and the second inverter, wherein the latch circuit is configured to produce an oscillating signal in response to the charging and the discharging of the first capacitor and the second capacitor in the vibrator circuit.

In another general aspect, the present invention relates to an oscillator circuit, including: a current source comprising an amplifier, a first resistor, a second resistor, and a third inverter whose input and output are connected and coupled with an input of the amplifier, wherein the amplifier is configured to generate a first current flowing through the first resistor and the second resistor; a vibrator circuit comprising a first capacitor and a second capacitor, wherein the first capacitor is configured to charge in response to the first current and discharge when the voltage across the first capacitor reaches a first threshold voltage of a first inverter and the second capacitor is configured to charge in response to the first current and discharge when the voltage across the first capacitor reaches a second threshold voltage of a second inverter, wherein the threshold voltage of the third inverter is substantially the same as the first threshold voltage or the second threshold voltage; and a latch circuit comprising the first inverter and the second inverter, wherein the latch circuit is configured to produce an oscillating signal in response to the charging and the discharging of the first capacitor and the second capacitor in the vibrator circuit.

In yet another general aspect, the present invention relates to a method for generating an oscillating output signal including producing, by an amplifier, a first current through a first resistor and a second resistor, wherein the first resistor has a positive temperature coefficient and the second resistor has a negative temperature coefficient, wherein an input of the amplifier is coupled with a third inverter whose input and output are connected; charging a first capacitor in response to the first current; discharging the first capacitor when the voltage across the first capacitor reaches a first threshold voltage of a first inverter; charging a second capacitor in response to the first current; discharging the second capacitor when the voltage across the second capacitor reaches a second threshold voltage of a second inverter; and producing an oscillating signal using a latch circuit in response to the voltage across the first capacitor and the voltage across the second capacitor.

Implementations of the system may include one or more of the following. The threshold voltage of the third inverter can be substantially the same as the first threshold voltage or the second threshold voltage. The first inverter, the second inverter, and the third inverter can be disposed adjacent to each other in the layout of the oscillator circuit. The first resistor can have a positive temperature coefficient and the second resistor has a negative temperature coefficient, and the first resistor and the second resistor are so arranged that resistance variation in the first resistor caused by a temperature change is substantially compensated by resistance variation in the second resistor caused by the temperature change. At least one of the first resistor and the second resistor can be variable and can be configured to be adjusted such that resistance variation in the first resistor caused by a temperature change is substantially compensated by resistance variation in the second resistor caused by the temperature change. The first resistor and the second resistor can be so arranged that total resistance of the first resistor and the second resistor is substantially insensitive to temperature variations within the operation temperature range of the oscillator circuit. The oscillator circuit can further include one or more transistors configure to form a current mirror to produce a second current in the vibrator circuit in response to the first current, wherein the second current is substantially the same as the first current. The second current can be configured to control the rate of charging in the first capacitor and the rate of charging in the second capacitor. The latch circuit can further include an SR latch including two mutually coupled NOR gates, wherein an input of each of the NOR gates is configured to receive the periodic voltage waveform through two serially connected inverters. The capacitance of at least one of the first capacitor and the second capacitor can be configured to be adjusted to vary the period of the oscillating signal to a predetermined value.

Embodiments may include one or more of the following advantages. An advantage of the disclosed oscillator circuit is that it includes features that automatically compensate the dependencies of oscillation frequency to variations in the supply voltage and temperature. The disclosed oscillator circuit includes an inverter in the current source. The inverter can sense and compensate the effects of supply voltage and temperature variations. In one implementation, a current source provides a charging current to timing capacitors through a current mirror. The strength of the charging current is determined by the threshold voltage of the inverter in the current source. The oscillation period is determined by the charging current and threshold voltages of the inverters in the latching circuit. The inverter in the current source is designed to have substantially identical threshold voltages. As a result, any variation in the threshold voltage due to supply voltage or temperature variations is compensated by the concurrent variation in source and the charging currents. The oscillation frequency is insensitive to the supply voltage and temperature variations.

Another advantage of the disclosed oscillator circuit is simpler and easier to implement comparing to the conventional oscillator circuit. The disclosed circuit can generate accurate and stable clock signals without the requirement of constant and highly accurate voltage or current reference. The disclosed oscillator circuit also does not include any high speed analog comparator and the reference voltage required in the comparator in some conventional oscillator circuit designs. The disclosed oscillator circuit includes a single current mirror unlike some conventional oscillators that include multiple current mirrors.

Another advantage of the disclosed oscillator circuit is that it includes functions and provides calibration technique that can compensate for the temperature dependence of its components. In one implementation, a network of resistors can be provided in the current source to provide a source current that is insensitive to temperature variations. In one implementation, resistors having positive temperature coefficients are included in conjunction with resistors having negative temperature coefficients to obtain a total resistance that is insensitive to temperature variations. The disclosed oscillator circuit can thus provide stable and accurate clock signals in the presence of temperature variations.

Yet another advantage of the disclosed oscillator circuit and methods is that procedures are provided to calibrate electronic components to enable the robust oscillating signals relative to temperature and supply voltage variations. In one implementation, the resistance of at least one resistor is variable, which can be adjusted to render the total resistance to be substantially insensitive to temperature variations. In another implementation, at least one capacitor is variable such that the period or frequency of the output oscillation signals can be adjusted according to specification.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

FIGS. 2A and 2B respectively illustrate the timing diagrams of the voltage signals at the nodes "S" and "R" in the oscillator circuit of FIG. 1.

FIGS. 3A and 3B respectively illustrate the timing diagrams of the voltage signals at the output nodes "ø1" and "ø2" in the oscillator circuit of FIG. 1.

DETAILED DESCRIPTION

Figure 1:
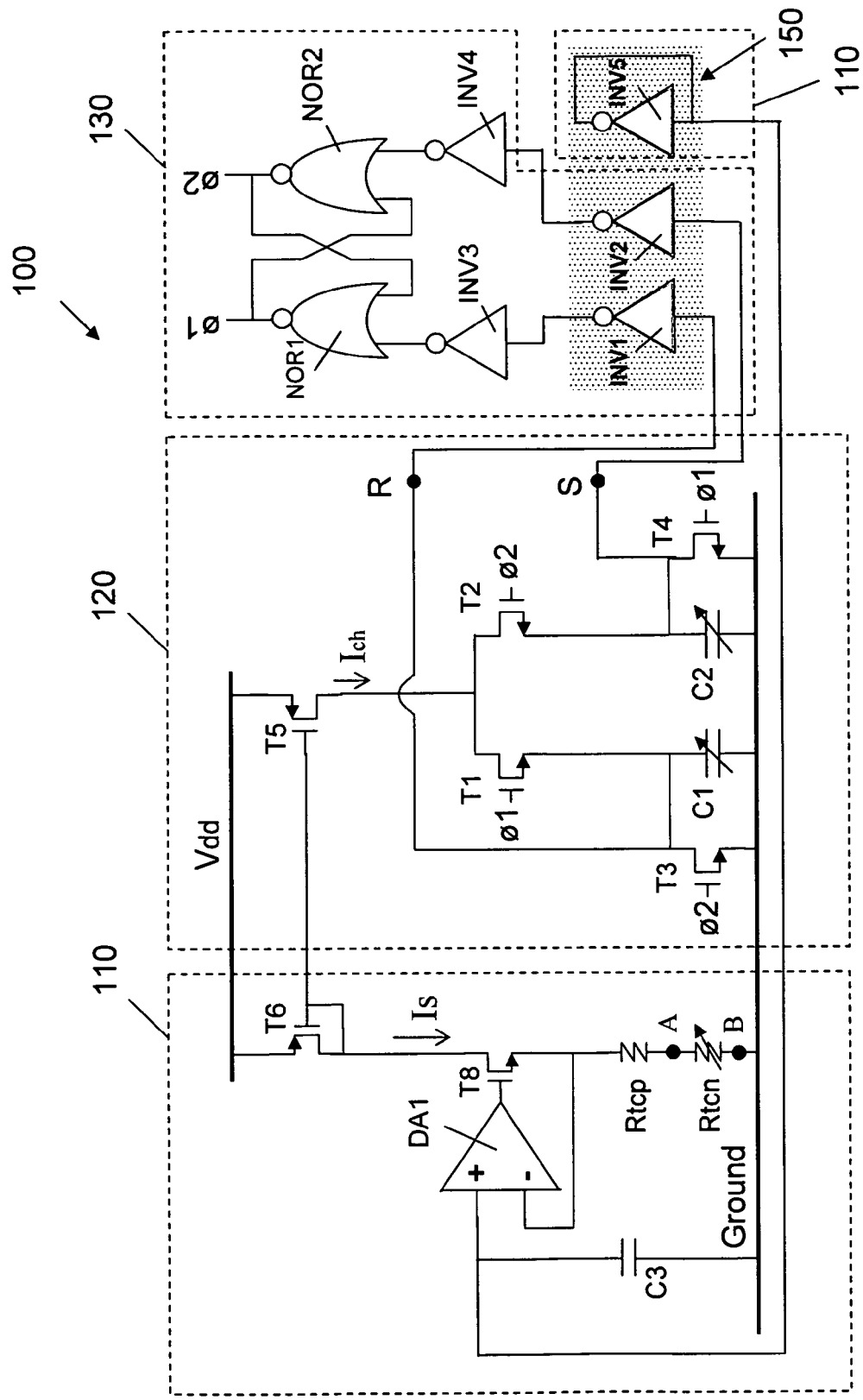
FIG. 1 is a schematic diagram of an oscillation circuit in accordance with the present specification.

FIG. 1 illustrates a schematic diagram of an oscillation circuit 100 in accordance with the present specification. The oscillation circuit 100 includes a current source 110, a vibrator circuit 120, and a latch circuit 130. The current source 110 includes a differential amplifier DA1, an inverter INV5, a capacitor C3, transistors T6 and T8, and resistors Trip and Tran. Tran can be a variable resistor whose resistance can be adjusted in the factory calibration to compensate temperature variations (see detailed discussions in relation with eqn. (12)). T8 is coupled with the output of the amplifier DA1. T8's collector is coupled with the power supply voltage Vdd through T6. T8's emitter is connected the negative input of DA1 and with Trip or Tran. Trip and Tran are serially connected between T8's emitter and the ground. The positive input of DA1 is coupled with INV5 and C3 that provides stability for the INV5 feedback loop. The differential amplifier DA1 can produce a source current Is flowing through T6, T8, and the serially connected Trip and Tran.

The vibrator circuit 120 includes a transistor T5 and two charging capacitors C1 and C2. In one embodiment, the charging capacitors C1 and C2 are variable and can be adjusted to produce the specified oscillation frequency (as described below). T5 is arranged as a current mirror coupled to T6, which produces a reflected current Itch that is substantially the same as the source current Is produced by DA1. Itch is configured to charge the capacitors C1 or C2 under the regulation of transistors T1, T2, T3, and T4. The capacitors C1 and C2 can be alternately charged or discharged. The charging and discharging of C1 are regulated by transistors T1 and T3. The charging and discharging of C2 are regulated by transistors T2 and T4.

The alternate charging and discharging of C1 and C2 can produce periodic voltage waveforms at nodes "S" and "R". The periodic voltage waveforms at nodes "S" and "R" are input to the latch circuit 130 to produce oscillating signals at the output nodes "ø1" and "ø2". The latch circuit 130 comprises a SR latch that includes two mutually coupled NOR gates NOR1 and NOR2. The output of NOR1 is coupled to an input of NOR2, and vice versa. Two serially connected inverters INV1 and INV3 are connected with an input to NOR1. Another two serially connected inverters INV2 and INV4 are connected with an input to NOR2. The periodic voltage waveforms at nodes "S" and "R" are respectively input to the inputs of the NOR1 and NOR2 through inverters INV1 and INV3, and the inverters INV2 and INV4. The toggling oscillating signals at the output nodes "ø1" and "ø2" of NOR1 and NOR2 are coupled to T1, T2, T3, and T4 to regulate the charging and discharging of C1 and C2.

The operation of the voltage oscillations of C1 and C2 is now described. The timing diagrams of the periodic voltage waveforms at the nodes "S" and "R" in the oscillator circuit 120 are respectively shown in FIGS. 2A and 2B. The timing diagrams of the oscillating signals at the output nodes "ø1" and "ø2" of the latch circuit 130 are respectively shown in FIGS. 3A and 3B. The oscillating signals at the output nodes "ø2" and "ø2" can include alternate out-of-phase square pulses. The time Tc1 that the signal at the node "ø1" spends at the high voltage in each period is the same as the time for the signal at the node "ø1" to spend at the low voltage state in the period. Similarly, the time Tc2 for the signal at the node "ø2" to spend at the high voltage is the same for the signal at the node "ø2" at the low voltage.

When "ø2" is on and "ø2" is off, T2 is open and T1 connects the circuit to allow the charging current Itch from T5 to charge the capacitor C1. The voltage across C1 rises to produce a ramp-up voltage at the node "R" as shown in FIG. 2A.

T3 opens the circuit and T4 is closed to discharge the capacitor C2 to produce a voltage drop to the low voltage at the node "S" as shown in FIG. 2B. The voltage drop in the capacitor discharge is normally much faster that the voltage ramp up process. The voltage at the node "R" continues to rise until it reaches a threshold voltage Vth1 of INV1, at which point the SR latch circuit toggles. The length of the charging period for C1 is Tc1. The output node "ø1" drops to the low voltage state; the output node "ø2" switches to a high voltage state. In response, T1 opens the circuit and T3 is closed to discharge the capacitor C1 to produce a voltage drop to the low voltage at the node "R" as shown in FIG. 2A. T4 is open and T2 closes the circuit to allow charging current Itch to charge the capacitor C2 to produce a ramp-up voltage at the node "S" as shown in FIG. 2B. When the voltage at the node "S" reaches the threshold voltage Vth2 of INV2, the voltages at the output nodes "ø1" and "ø2" will toggle again. The charging period for C2 lasts Tc1. The capacitor C2 switches from a charging mode to a discharging mode while the capacitor C1 switches from a discharging mode to the charging mode.

Since the charging of the capacitors C1 and C2 controls the period (that is the sum of Tc1 and Tc2) and thus the frequency of the oscillation signals at the output nodes "ø1" and "ø2", the capacitors C1 and C2 can also be referred as timing capacitors.

Figure 4:
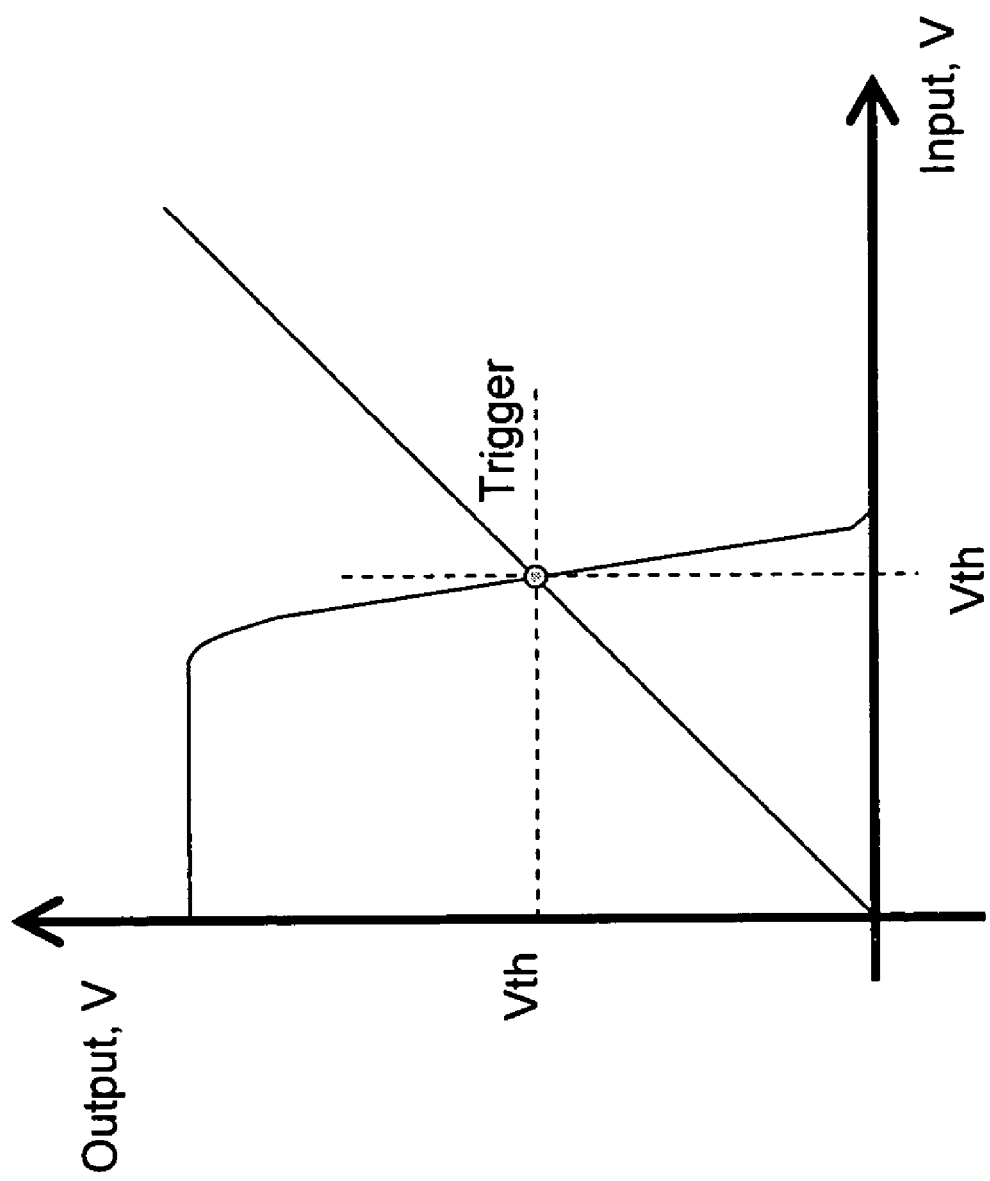
FIG. 4 illustrates the dependence of output voltage versus the input voltage for a common inverter.

In general, INV1 and INV2 can have different threshold voltages such that the voltage ramp-ups at the C1 and C2 can trigger the toggling of the latch circuit 130 at different threshold voltages. The transfer characteristics of an inverter are shown in FIG. 4. The threshold voltage of an inverter is simply determined by the point in the response curve at which the input voltage is equal to the output voltage. The point of the curve at which the input voltage equals the output voltage is also referred as the trigger point.

In one implementation, INV1, INV2 and INV5 in the oscillation circuit 100 can be designed to closely match with each another such that they all have substantially the same electrical properties and substantially the same threshold voltage. INV1, INV2, and INV5 are designed to have substantially the same size and physically close to each other in an area 150 of the circuit layout. In other words, INV1, INV2, and INV5 are disposed in the vicinity of each other in the are 150 in the layout of the oscillator circuit 100. INV1, INV2, and INV5 can thus have substantially the same electrical characteristics (as shown in FIG. 4) and substantially the same threshold voltages. Furthermore, INV1, INV2, and INV5 can experience substantially the same effects caused by supply voltage and temperature variations.

The input and output of INV5 are shorted. The trigger point of INV5 is therefore determined by the voltage at its output. The input and the output voltages of INV5 are both held at the threshold voltage.

Assuming that the threshold voltages Vth1, Vth2, and Vth5 for INV1, INV2, and INV5 are substantially the same: Vth1=Vth2=Vth5=Vth. The charging times Tc1 and Tc2 for C1 and C2 can be respectively determined by eqns. (1) and (2):

$$Tc1=Ca1*(Vth/Ich) \qquad \text{eqn. (1)}$$

$$Tc2=Ca2*(Vth/Ich) \qquad \text{eqn. (2)}$$

in which Ca1 and Ca2 are respectively the capacitances for the capacitors C1 and C2. The period T for the oscillating signals at the output nodes "ø1" or "ø2" is therefore:

$$T=(Ca1+Ca2)*(Vth/Ich) \qquad \text{eqn. (3)}$$

INV5 is configured to dynamically sense the corresponding threshold voltages of INV1 and INV2, and to make corrections to the source current Is and thus the charging current Ich. Variations in the threshold voltages of INV1 and INV2 can be dynamically compensated. The source current Is in the current source 110 is determined by $$Is=Vth/(Rn+Rp), \qquad \text{eqn. (4)}$$

wherein Rn and Rp are respectively the resistances of the resistors Tran and Trip. In addition, the current mirror requires:

$$Ich=Is \qquad \text{eqn. (5)}$$

The period T for the oscillating signals at the output nodes "ø1" or "ø2" can therefore be expressed as $$T=(Ca1+Ca2)*Rtotal \qquad \text{eqn. (6)}$$

wherein $$Rtotal=Rn+Rp. \qquad \text{eqn. (7)}$$

Hence, the period T of the oscillating signals only depends on passive components C1, Ca2, Tran, and Trip. In other words, certain variations that are common to Vth and Ich in eqn. (3) are cancelled by the ratio Vth/Ich such that the period of the oscillating signals expressed in eqn. (6) is not dependent on the threshold voltage Vth, the charging current Ich, or the source current Is. Threshold voltages of inverters can generally be dependent on the properties of the inverters, temperature, the power supply voltage Vdd, as well as fabrication process parameters. The independence of the period T on the threshold voltage(s) removes the sensitivity of the period T on power voltage variations, which is a significant advantage of the oscillation circuit 100.

The capacitances Ca1 and Ca2 can be selected to vary the relative times spent at high voltage and the low voltage states (thus varying the duty cycle) of the oscillating signals at the output nodes "ø1" or "ø2". In one implementation, the capacitances Ca1 and Ca2 are substantially the same, which leads to substantially equal Tc1 and Tc2, that is, oscillating signals having duty cycles of 50% at the output nodes "ø1" or "ø2".

In an embodiment of the present specification, the temperature dependence of the resistances Rn and Rp can be compensated to provide stable oscillation frequencies in the oscillating signals even in the presence of temperature variations. As shown in eon (6), the period T of the oscillating signals is dependent on the sum of Rn and Rp, and the capacitances Ca1 and Ca2 of the timing capacitors. The temperature dependence of the oscillating frequency is dominated by Total. In accordance with the present specification, the resistors Tran and Trip can be selected such that Tran has a negative temperature coefficient Coffin and Trip has a positive temperature coefficient Scoff. Accounting the temperature effect of the resistors $$Rn=Rn_{nom}[1+Tcoffin*(T-Tnom)] \qquad \text{eqn. (8)}$$

$$Rp=Rp_{nom}[1+Tcoifs*(T-Tnom)] \qquad \text{eqn. (9)}$$

$$Rtotal=Rn_{nom}[1+Tcoffin*(T-Tnom)]+RP_{nom}[1+Tcoifs*(T-Tnom)] \qquad \text{eqn. (10)}$$

wherein Scoff is positive and Coffin is negative. $Rp_{nom}$ is the resistance of Rp at a nominal temperature. $Rn_{nom}$ is the resistance of Rn at the nominal temperature. In an embodiment of the present specification, the nominal temperature is the room temperature, which is approximately 25° C.

In one implementation, Rtcp can be selected to be a poly resistor that has a small positive temperature coefficient (Scoff) of approximately 500 ppm/C°. Rtcn can be selected to be a lightly doped poly resistor (high resistive poly), which may gave a temperature coefficient (Coffin) of approximately −2000 ppm/C°. Hence, a small Rn can be used to compensate the temperature variation of Rtcp. The values of Rtcp and Rtcn are chosen such that they provide independence to temperature in Total, that is:

$$d\,Rtotal/dT = Rn_{nom} * Tcoeffn + Rp_{nom} * Tcoeffp = 0 \qquad \text{eqn. (11)}$$

which leads to $$Rp_{nom}/Rn_{nom} = -Tcoffin/Tcoifs. \qquad \text{eqn. (12)}$$

Eqn (12) allows the total resistance Total of the Rtcp and Rtcn to be substantially independent to temperature in the operation range of the oscillator circuit 100. In other word, temperate-related resistance variations in Rtcp and Rtcn can substantially compensate each other within the operation temperature range. An exemplified operation temperature range for the oscillation circuit 100 is from −40° C. to 125° C.

The factory calibration of Rtcp and Rtcn is now described. First, the temperature coefficients Scoff and Coffin of the resistors Rtcp and Rtcn are respectively determined. For example, Rn is measured at a high temperature This and a nominal temperature Tom. The temperature coefficient Coffin is computed by the following equations:

$$Tcoeffn = ((Rtcn_{hi}/Rtcn_{nom})-1)/(Thi-Tnom) \qquad \text{eqn. (13)}$$

wherein $Rtcn_{hi}$ and $Rtcn_{nom}$ are the measured resistance values at the higher temperature and nominal temperature respectively.

Figure 5:
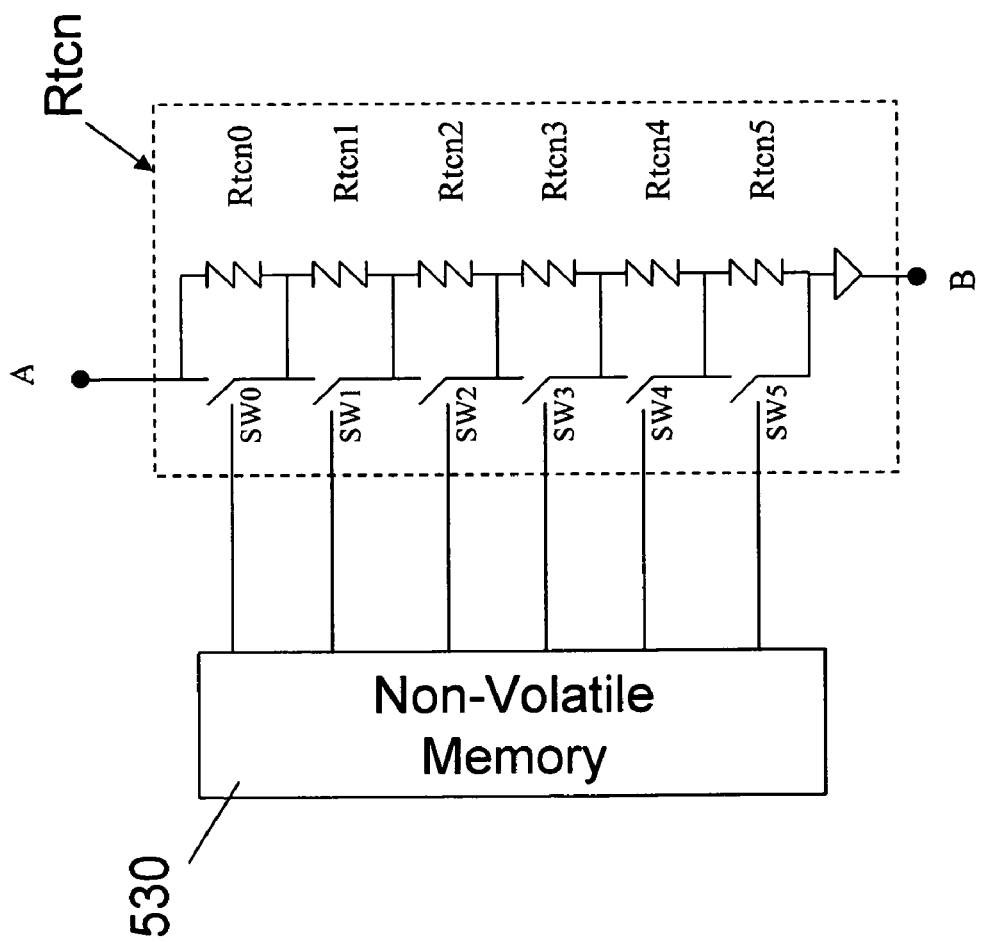
FIG. 5 is a detailed diagram of the variable resistor Tran between the node "A" and the "B" of FIG. 1.

The resistance of the resistor Rtcp at the nominal temperature, $Rp_{nom}$, is next measured for every device containing the oscillation circuit 100. FIG. 5 is a detailed diagram of the variable resistor Rtcn between the node "A" and the "B" of FIG. 1. Rtcn includes several serially connected resistors Rtcn0-Rtcn5, as shown in FIG. 5. The resistances for the resistors Rtcn0-Rtcn5 is selected to have the total resistance value Rn slightly larger than that is required by eon (12). The connections between the resistors Rtcn0-Rtcn5 can be dynamically controlled by a plurality of switches SW5-SW0. For example, Rn0 can be shorted by closing SW0 around Rn0 so the total resistance does not include that of Rn0. Rn can then adjusted by controlling the switches SW5-SW0 to one of the two positions until $Rn_{nom}$ satisfies eon (12). The on/off states of the switches SW5-SW0 for the calibrated Rn configuration can be read and stored in the Non-Volatile memory 530.

After the resistance values are finalized using the procedure above, the capacitance Ca1 and Ca2 can be adjusted for every device such that the period T as expressed by eqn. (6) can precisely produce the required oscillating frequency in the oscillation signals. Slightly larger capacitance values are normally selected to allow the capacitances to be adjusted down to the required values. For example, if a nominal frequency of 10 MHz is specified for the oscillating frequency at the output nodes "ø1" and "ø2", the total capacitance Ca1+ Ca2 is required to be adjusted to be $$Ca1 + Ca2 = 0.1\,\mu s/(Rn + Rp) \qquad \text{eqn. (14)}$$

For example, to produce oscillating signals having 50% duty cycles, $$Ca1 = Ca2 = 0.05\,\mu s/(Rn + Rp) \qquad \text{eqn. (15)}$$

Figure 6:
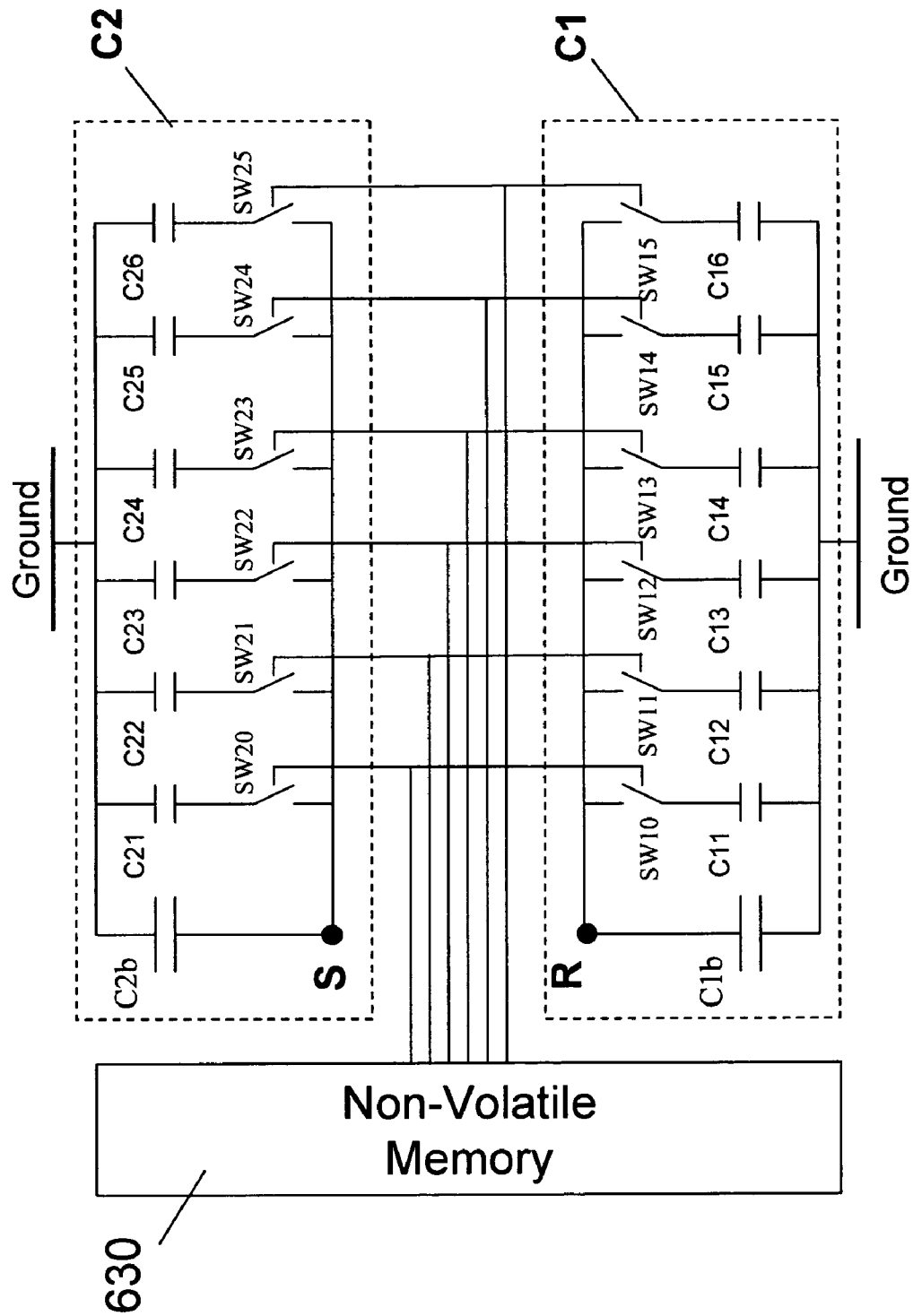
FIG. 6 is a detailed diagram of the capacitors C1 and C2 between the nodes "S" and "R" and the ground in FIG. 1.

In one implementation for the capacitance adjustment, FIG. 6 is a detailed diagram of the capacitors C1 and C2 between the nodes "S" and "R" and the ground in FIG. 1. The capacitor C1 includes a network of C1b and several small capacitors C11-C16 that can each be connected or disconnected by switches SW11-SW16. The capacitor C1 includes a network of C2b and several small capacitors C21-C26 that can each be connected or disconnected by switches SW21-SW26. The capacitances Ca1 and Ca2 can be adjust through the on/off of switches SRC10-SRC16 and SRC20-SRC26 respectively. The final calibration value can be read and stored into the Non-Volatile Memory 630.

It is understood that the disclosed circuit and methods are compatible with other configurations of the electronic components and variations in circuit designs without deviation from the spirit of the present specification. Various forms of resistors, capacitors, transistors, and amplifiers can be used to achieve similar results as described above. The latch circuit can be based on other logic gate designs that are Boolean equivalents to NOR1 and NOR2.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. An oscillator circuit, composing:
   a current source comprising an amplifier, a first resistor, a second resistor. and a third inverter whose input and output are connected and coupled with an input of the amplifier, wherein the amplifier is configured to generate a first current flowing through the first resistor and the second resistor;
   a vibrator circuit comprising a first capacitor and a second capacitor, wheren the first capacitor is configured to charge in response to the first current and discharge when the voltage across the first capacitor reaches a first threshold voltage of a first inverter and the second capacitor is configured to charge in response to the first current and discharge when the voltace across the first capacitor reaches second threshold voltage of a second inverter; and
   a latch circuit comprising the first inverter and the second inverter, wherein the latch circuit is configured to produce an oscillating signal in response to the charging and the discharging of the first capacitor and the second capacitor in the vibrator circuit, wherein the threshold voltage of the third inverter is substantially the same as the first threshold voltage or the second threshold voltage, and wherein tie first inverter, the second inverter, and the third inverter are disposed adjacent to each other in the layout of the oscillator circuit.

2. The oscillator circuit of claim 1, wherein the first threshold voltage is substantially the same as the second threshold voltage.

3. The oscillator circuit of claim 1, wherein the first threshold voltage is different from the second threshold voltage.

4. The oscllator circuit of clam 1, wherein the first resistor has a positive temperature coefficient and the second resistor has a negative temperture coefficient, and the first resistor and the second resistor are so arranged that resistance variation in the first resistor caused by a temperature change is substantially compensated by resistance variation in the second resistor caused by the temperature change.

5. The oscillator circuit of claim 4, wherein at least one of the first resistor and the second resistor is variable and is configured to be adjusted such that resistance variation in the first resistor caused by a temperature change is substantially compensated by resistance variation in the second resistor caused by the temperature change.

6. The oscillator circuit of claim 1, wherein the first resistor and the second resistor are so arranged that total resistance of the first resistor and the second resistor is substantially insensitive to temperature variations within the operation temperature range of the oscillator circuit.

7. The oscillator circuit of claim 1, further comprising one or more transistors configure to form a current mirror to produce a second current in the vibrator circuit in response to the first current, wherein the second current is substantially the same as the first current.

8. The oscillator circuit of claim 7, wherein the second current is configured to control the rate of charging in the first capacitor and the rate of charging in the second capacitor.

9. The oscillator circuit of claim 1, wherein the latch circuit further comprises an SR latch including two mutually coupled NOR gates, wherein an input of each of the NOR gates is configured to receive the periodic voltage waveform through two serially connected inverters.

10. The oscillator circuit of claim 1, wherein the capacitance of at least one of the first capacitor and the second capacitor is configured to be adjusted to vary the period of the oscillating signal to a predetermined value.

11. An oscillater circuit, comprising:
a current source comprising an amplifer, a first resistor, a second resistor, and a third inverter whose input and output are connected and coupled with an input of the amplifier, wherein the armplifier is configured to generate a first current flowing through the first resistor and the second resistor;
a vibrator circuit comprising a first capacitor and a second capacitor, wherein the first capacitor is configured to charge in response to the first current and discharge when the voltage across the first capacitor reaches a first threshold voltage of a first inverter and the second capacitor is configured to charge in response to the first current and discharge when the voltage across the first capacitor reaches a second threshold voltage of a second inverter. wherein the threshold voltage of the third inverter is substantially the same as the first threshold voltage or the second threshold voltage, wherein the first inverter, the second inverter, and the third inverter are disposed adjacent to each other in the layout of the oscillator circuit; and
a latch circuit comprising the first inverter and the second inverter, wherein the latch circuit is configured to produce an oscillating signal in response to the charging and the discharging of the first capacitor and the second capacitor in the vibrator circuit.

12. The oscillator circuit of claim 11, wherein the first threshold voltage is substantially the same as the second threshold voltage.

13. A method for generating an oscillating output signal, comprising:
producing, by an amplifier, a first current through a first resistor and a second resistor, wherein the first resistor has a positive temperature coefficient and the second resistor has a negative temperature coefficient, wherein an input of the amplfier is coupled with a third inverter whose input and output are connected;
charging a first capacitor in response to the first current;
discharging the first capacitor when the voltage across the first capacitor reaches a first threshold voltage of a first inverter;
charging a second capacitor in response to the first current
discharging the second capacitor when the voltage across the second capacitor reaches a second threshold voltage of a second inverter, wheren the first inverter, the second inverter, and the third inverter are adjacent to each other in the layout of the oscillator circuit and wherein the threshold voltage of the third inverter is substantially the same as the first threshold voltage or the second threshold voltage; and
producing an oscillating signal using a latch circuit in response to the voltage across the first capacitor and the voltage across the second capacitor.

14. The method of claim 13, wherein the threshold voltage of the third inverter is substantially the same as the first threshold voltage or the second threshold voltage.

15. The method of claim 13, wherein the first threshold voltage is substantially the same as the second threshold voltage.

16. The method of claim 13, wherein the first resistor has a positive temperature coefficient and the second resistor has a negative temperature coefficient.

17. The method of claim 13, wherein the first resistor and the second resistor are serially connected.

18. The method of claim 13, further comprising:
varying the resistance of at least one of the first resistor and the second resistor such that the total resistance of the first resistor and the second resistor is substantially insensitive to temperature variations within a specified operation temperature range.

19. The method of claim 13, further comprising:
varying the capacitance of at least one of the first capacitor and the second capacitor to set the oscillaton frequency to a predetermined value.

* * * * *